United States Patent
Guan et al.

(10) Patent No.: US 7,186,912 B2
(45) Date of Patent: Mar. 6, 2007

(54) HERMETIC LID SEAL BY METAL PRESSING FOR FIBER OPTIC MODULE

(75) Inventors: William Z. Guan, Union City, CA (US); Giovanni Barbarossa, Saratoga, CA (US)

(73) Assignee: Avanex Corporation, Fremont, CA (US)

( * ) Notice: Subject to any disclaimer, the term of this patent is extended or adjusted under 35 U.S.C. 154(b) by 161 days.

(21) Appl. No.: 10/671,748

(22) Filed: Sep. 26, 2003

(65) Prior Publication Data

US 2005/0067176 A1    Mar. 31, 2005

(51) Int. Cl.
*H02G 3/08*     (2006.01)

(52) U.S. Cl. ............. 174/50; 174/17 R; 174/520; 174/521; 220/3.2

(58) Field of Classification Search ........... 174/17 CT, 174/17 R, 50, 50.5, 50.51, 52.3, 52.2, 17.05, 174/52.1, 35 GC; 220/3.2, 3.3, 3.8, 4.02; 439/535, 536; 385/134, 135; 100/54; 361/600, 361/601

See application file for complete search history.

(56) References Cited

U.S. PATENT DOCUMENTS

| | | | | |
|---|---|---|---|---|
| 3,575,546 A | * | 4/1971 | Liautaud | 174/52.2 |
| 3,648,337 A | * | 3/1972 | Greskamp et al. | 174/52.2 |
| 4,567,318 A | * | 1/1986 | Shu | 174/35 GC |
| 4,620,061 A | * | 10/1986 | Appleton | 220/3.8 |
| 4,950,002 A | | 8/1990 | Hormansdorfer | |
| 5,153,380 A | * | 10/1992 | Chang | 174/52.1 |
| 5,534,664 A | * | 7/1996 | Fearing et al. | 174/50 |
| 5,703,754 A | * | 12/1997 | Hinze | 174/52.2 |
| 5,880,401 A | * | 3/1999 | Leischner et al. | 174/17 CT |
| 6,570,089 B1 | * | 5/2003 | McGrew et al. | 174/50 |
| 6,586,674 B2 | * | 7/2003 | Krause et al. | 174/50.5 |
| 6,798,966 B2 | * | 9/2004 | Loh | 385/134 |
| 6,831,222 B2 | * | 12/2004 | Pastuch | 174/17 CT |
| 2002/0044376 A1 | | 4/2002 | Serizawa et al. | |
| 2002/0062968 A1 | | 5/2002 | Krause et al. | |

FOREIGN PATENT DOCUMENTS

| | | |
|---|---|---|
| DE | 2652262 | 5/1978 |
| DE | 2707234 | 8/1978 |

OTHER PUBLICATIONS

EP Search Report, Application No. 04022666, dated Jan. 3, 2005.

* cited by examiner

*Primary Examiner*—Angel R. Estrada
(74) *Attorney, Agent, or Firm*—Patterson & Sheridan, LLP

(57) ABSTRACT

The invention describes a fiber optic module package which uses a metal-to-metal contact seal between a lid and a module housing. The metal-to-metal contact seal provides a sealing mechanism between the lid and the module housing. The module housing has a knife-shaped edge that can bite into a bottom surface of the lid when pressure is exerted on the lid. In a first embodiment, the module housing has a side slot in which an outer wall of the lid can enter which serves as a holding mechanism between the lid and the module housing. In a second embodiment, the module housing has an interior wall which can be pressed into a curved surface of the lid that serves as a holding mechanism between the lid and the module housing. In a third embodiment, multiple screws are inserted through multiple holes on the lid and into the module housing which serve as a holding mechanism between the lid and the module housing.

22 Claims, 17 Drawing Sheets

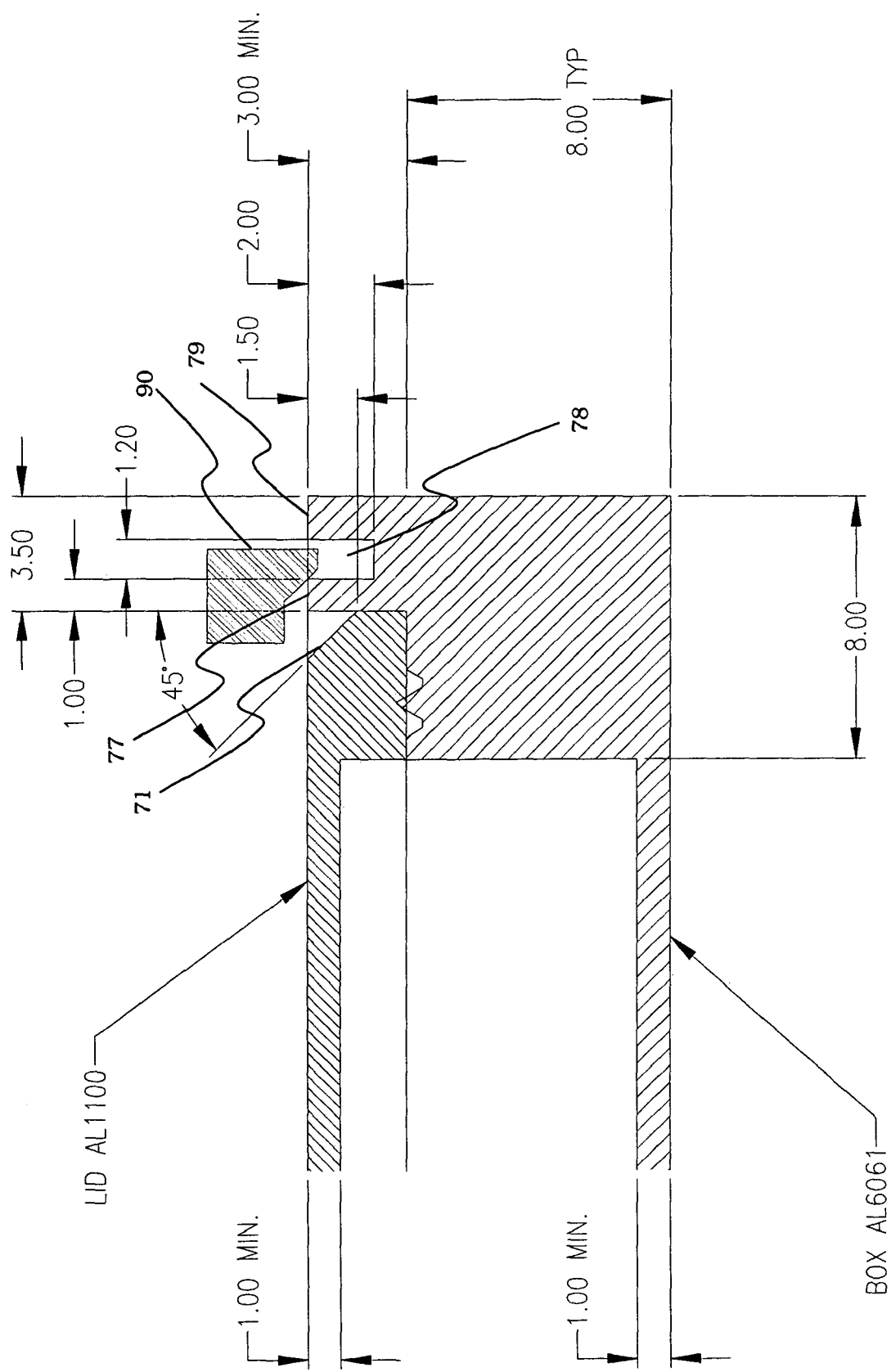

HERMETIC LID SEAL BY METAL PRESSING FOR FIBER OPTIC MODULE

BACKGROUND INFORMATION

1. Field of the Invention

The invention relates to the field of optics, and more particularly to packaging of fiber optic modules.

2. Description of Related Art

Fiber optics transmission is a common platform for transporting voice, data, and images. An optical device such as a multiplexer processor, an optical filter, or an optical amplifier is typically hermetically sealed in a module package, which protects the component from its operational environment such as moisture and pressure. The tight sealing package, i.e. hermetic sealing package, prevents moisture or other gas from passing through, thereby ensuring stable performance of an optical device during its life span.

An optical module typically has a lid and a module box for placement of one or more optical devices. Conventional solutions to assemble the lid and the module box include soldering, laser welding, and epoxy seal. However, Some of these techniques can expose an optical module to moisture penetration into the optical devices inside an optical module and may require complex manufacturing equipment or process.

Accordingly, it is desirable to have a fiber optical module package that uses an improved sealing technique between a lid and a module housing for minimizing or eliminating moisture penetration as well as providing a simpler manufacturing process.

SUMMARY OF THE INVENTION

The invention describes a fiber optic module package which uses a metal-to-metal contact seal between a lid and a module housing. The metal-to-metal contact seal provides a sealing mechanism between the lid and the module housing. The module housing has a knife-shaped edge that can bite into a bottom surface of the lid when pressure is exerted on the lid. In a first embodiment, the module housing has a side slot in which an outer wall of the lid can enter that serves as a holding mechanism between the lid and the module housing. In a second embodiment, the module housing has an interior wall which can be pressed into a curved surface of the lid that serves as a holding mechanism between the lid and the module housing. In a third embodiment, multiple screws are inserted through multiple holes on the lid and into the module housing that serve as a holding mechanism between the lid and the module housing.

A fiber optic module package comprises a lid having a bottom surface; and a module housing having a knife-shaped edge; wherein the lid and the module housing are sealed when the knife-shaped edge bites into the bottom surface of the lid to form a sealing mechanism.

Advantageously, the present invention minimizes or eliminates moisture penetration between the lid and the module box by using the metal-to-metal contact sealing. Furthermore, the present invention advantageously provides a screwless hermetic lid seal in a fiber optic module.

Other structures and methods are disclosed in the detailed description below. This summary does not purport to define the invention. The invention is defined by the claims.

BRIEF DESCRIPTION OF THE DRAWINGS

FIG. 10 is a structural diagram illustrating an exemplary dimension in the second embodiment of the screwless fiber optic module package with a cross-sectional view of the sealing mechanism after compression and the holding mechanism before compression in accordance with the present invention.

DETAILED DESCRIPTION OF PREFERRED EMBODIMENTS

Figure 1:
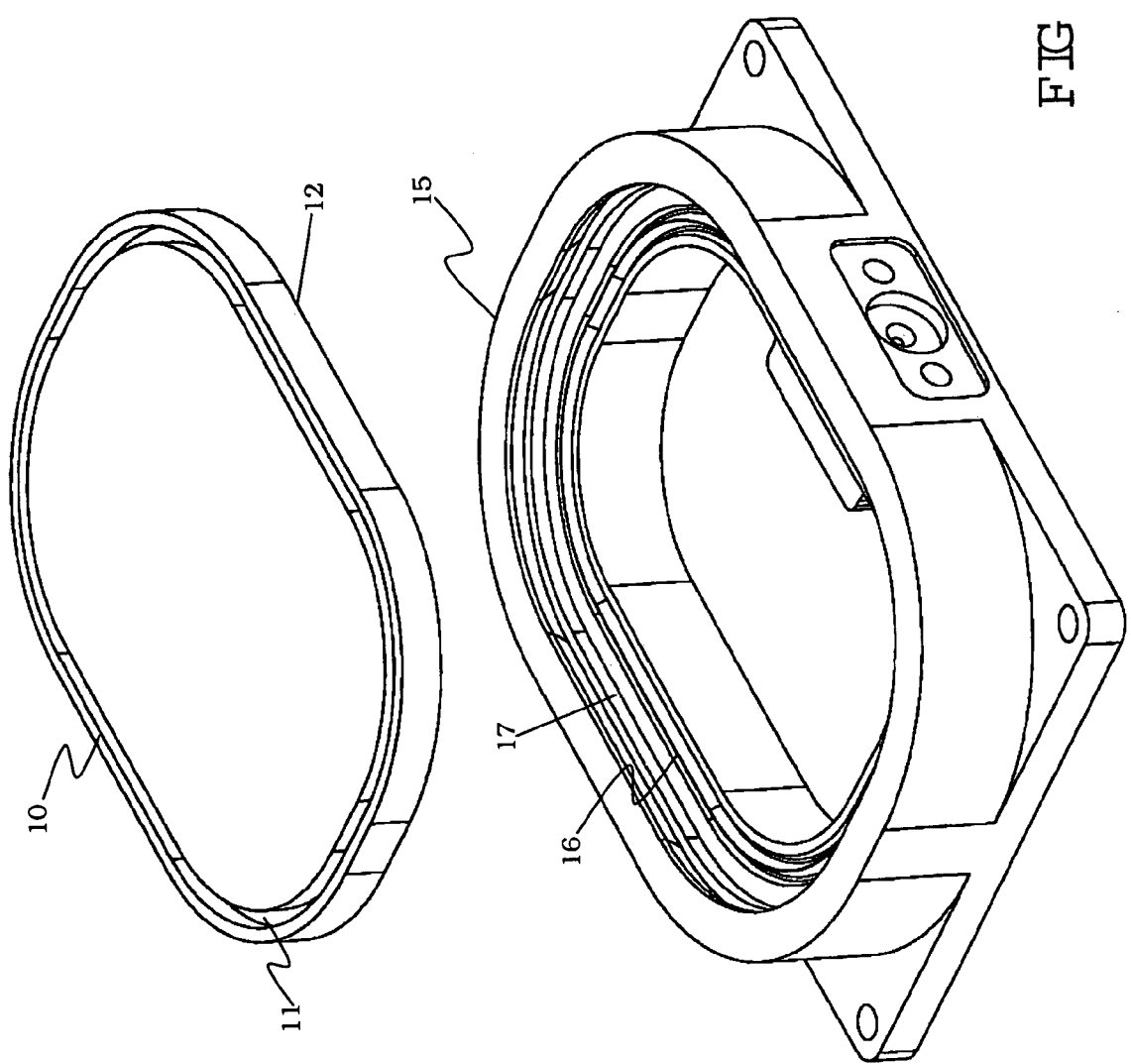
FIG. 1 is a structural diagram illustrating a first embodiment in an exploded ISO view of a lid and a module housing before sealing in accordance with the present invention.

Referring now to FIG. 1, there is shown a structural diagram illustrating a first embodiment in an exploded ISO view of a lid 10 and a module housing 15 before sealing in accordance with the present invention. The dimension of the lid 10 is suitable for placement into the module housing 15. The lid 10 has a cylindrical-shaped slot 11 that is cut near the edge of the lid 10 for serving as a holding mechanism between the lid 10 and the module housing 15 after compression. The cylindrical-shaped slot 11 resembles a running track that extends all the way around the lid 10.

The module housing 15 has a knife-shaped edge 16 surrounding the interior of the module housing 15 for biting into the lid 10 to form a sealing mechanism. In this embodiment, the knife-shaped edge 16 protrudes upward for making contact with a bottom surface 12 of the lid 10 when the lid 10 is placed over the module housing 15. The knife-shaped edge 16 resembles a sharp edge that has a knife-edge quality which is able to bite into the bottom surface 12 of the lid 10 when pressure is applied to the lid 10. The module housing 15 further has a side slot 17 which serves as an opening for pressing the lid 10 into the side slot 17 to form a holding mechanism between the lid 10 and the module housing 15.

The lid 10 and the module housing 15 can be selected from a various combination of materials. For example, the module housing 15 can be made from a hard material, such as a hard aluminum (like Alloy 6061), while the lid 10 is made from a soft aluminum (like Alloy 1100). One of ordinary skill in the art should recognize that other type of materials can be used for making the lid 10 as well as the module housing 15, such as aluminum alloy, stainless steel, copper, and titanium, without departing from the spirits of the present invention.

Figure 2:
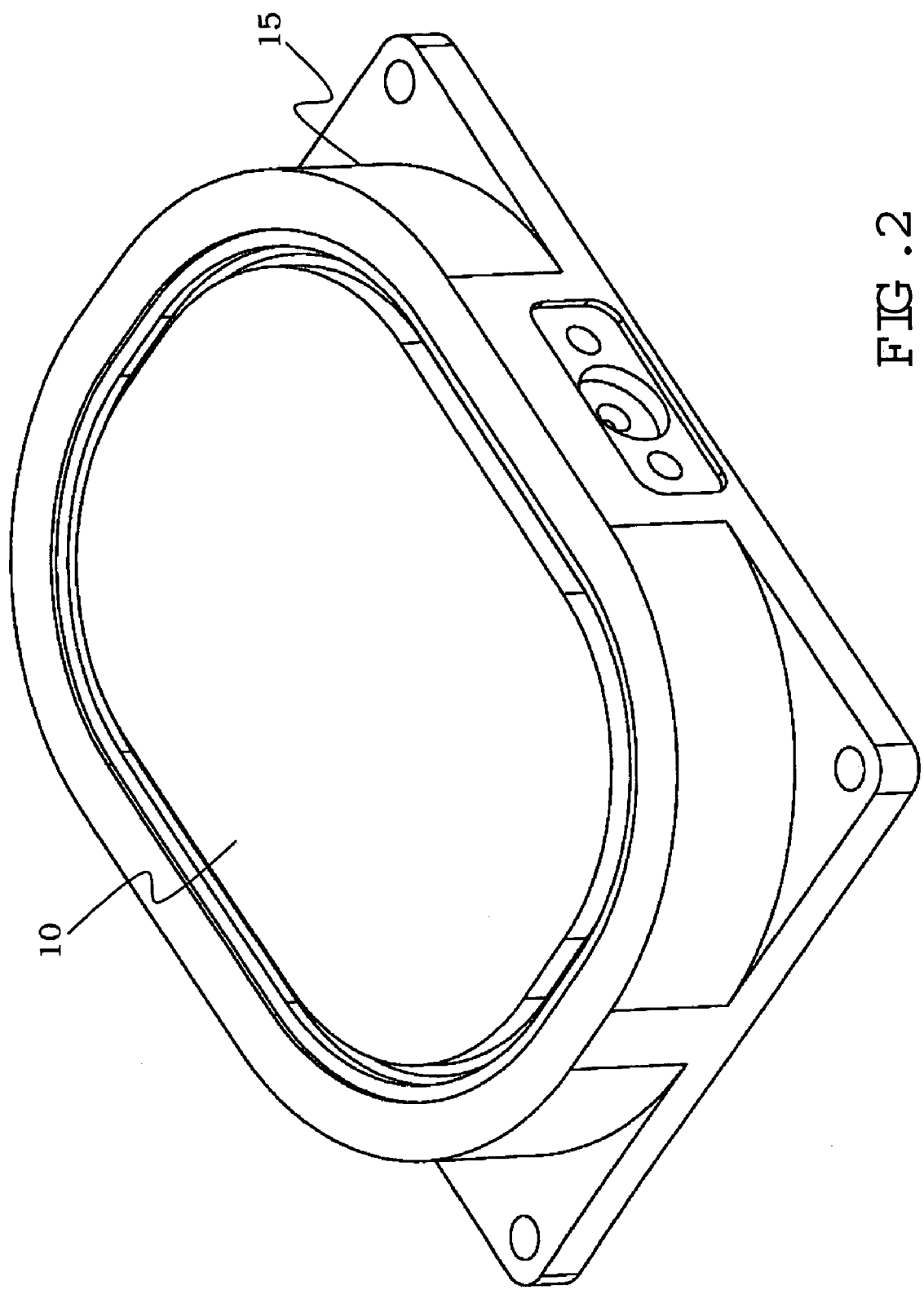
FIG. 2 is a structural diagram illustrating the first embodiment in an ISO view of a screwless fiber optic module package after sealing in accordance with the present invention.

A structural diagram in FIG. 2 illustrates the first embodiment in an ISO view of a screwless fiber optic module package 20 after sealing in accordance with the present invention. The lid 10 is first inserted into the module housing 15, followed by exerting pressure onto the lid 10 so that the knife-shaped edge 16 of module housing 15 bites into the bottom surface 12 of the lid 10 to form a sealing mechanism.

Figure 3:
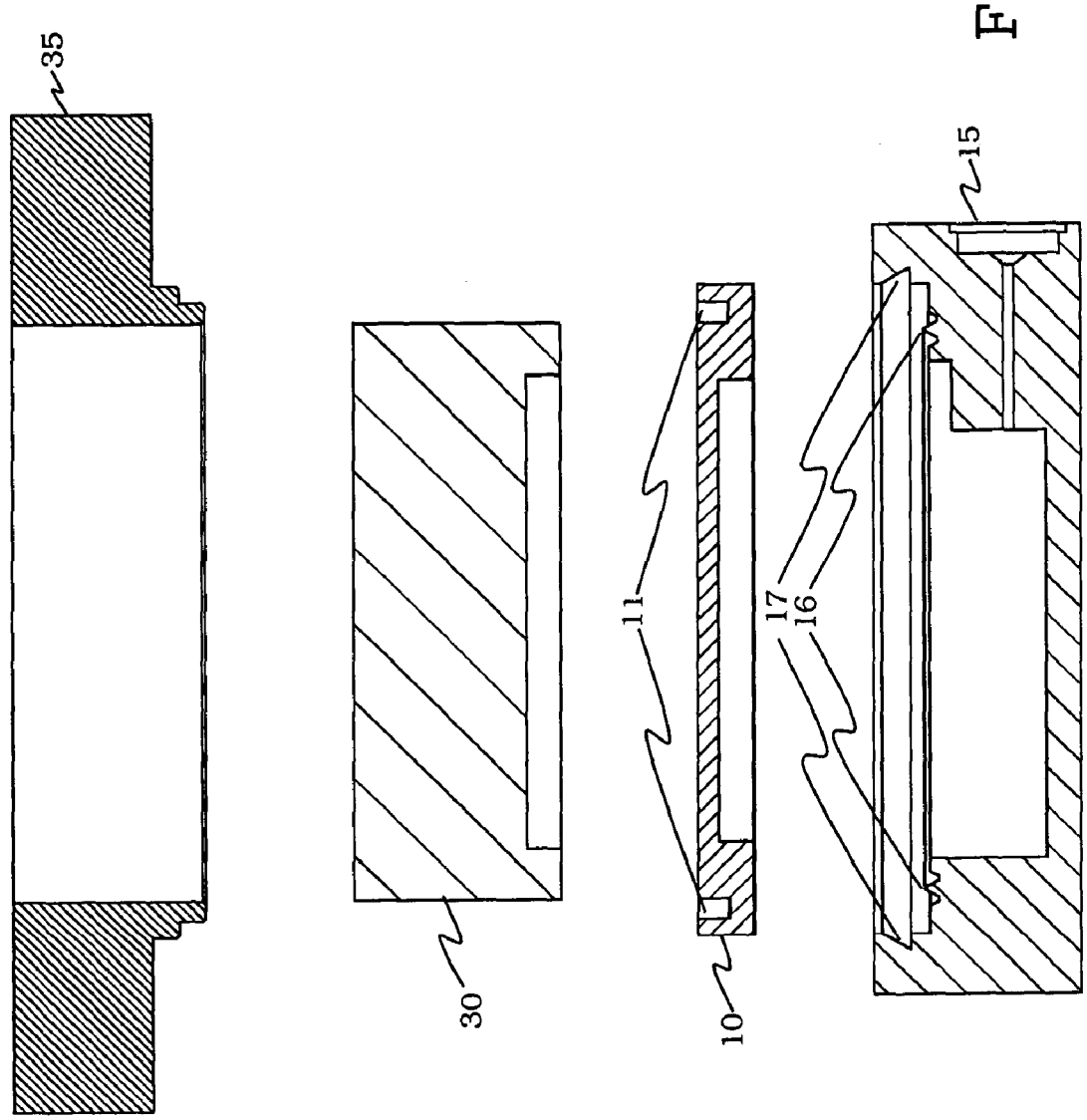
FIG. 3 is a structural diagram illustrating the first embodiment in an exploded cross-sectional view of the elements in making the screwless fiber optic module package using a metal-to-metal contact seal in accordance with the present invention.

In FIG. 3, there is shown a structural diagram illustrating the first embodiment in an exploded view of the elements in making the screwless fiber optic module package 20 using a metal-to-metal contact seal in accordance with the present invention. The fiber optic module package 20 comprises the module housing 15 with the knife-shaped edge 16 surrounding the interior of the module housing 15 and the lid 10 having the cylindrical-shaped slot 11 surrounding the interior of the lid 10. During compression, a center die 30 is used to press the lid 10 onto the module housing 15 so that the knife-shaped edge in the module housing bites into the lid 10 for forming a sealing mechanism or a sealing line. In addition, a surrounding forming die 35 is used to press the cylindrical-shaped slot 11 of the lid 10 into the side slot of 17 of the module housing 15 which serves as the holding mechanism between the lid 10 and the module housing 15.

Figure 4:
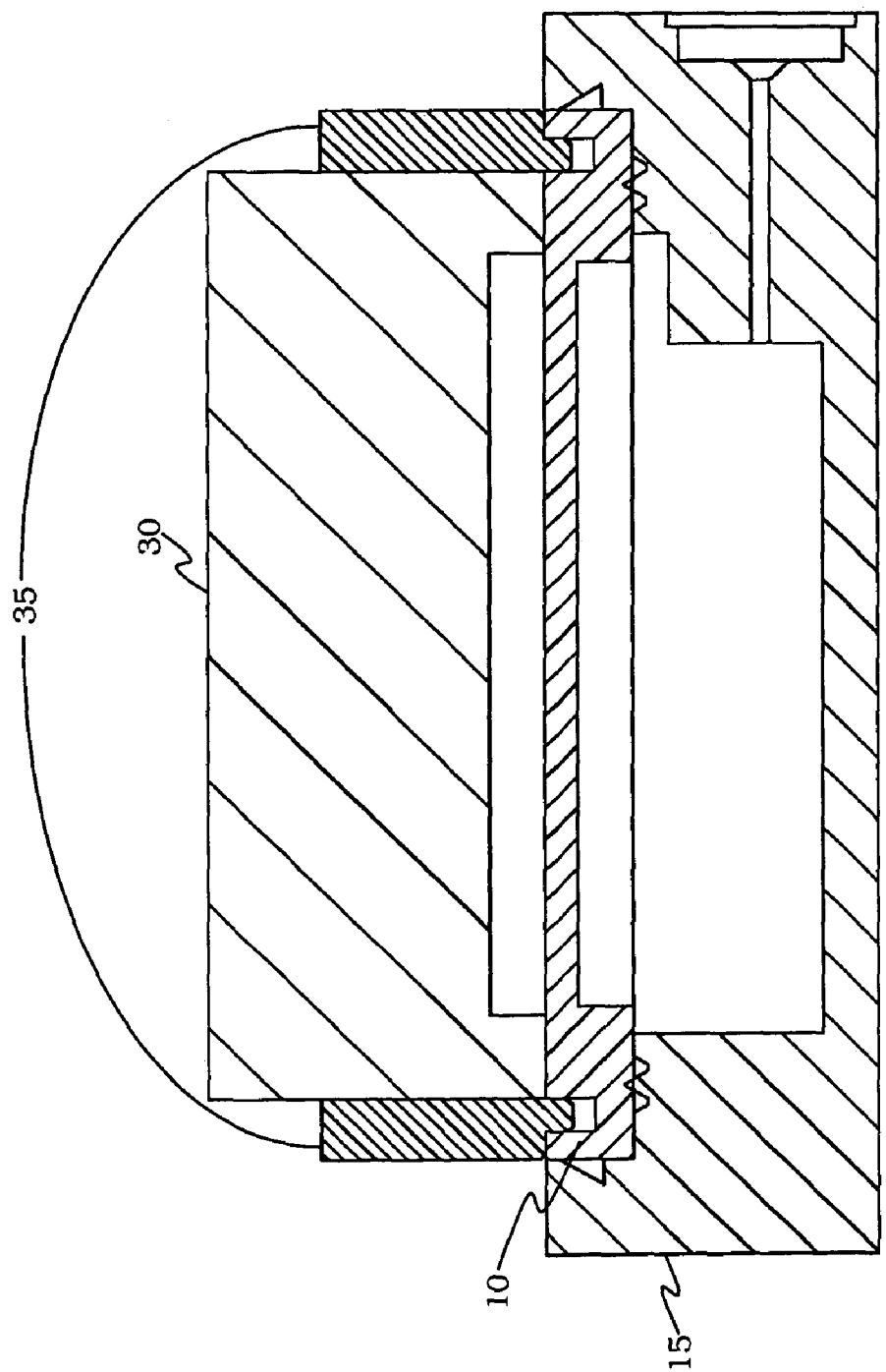
FIG. 4 is a structural diagram illustrating the first embodiment in a cross-sectional view of the elements in making the screwless fiber optic module package before sealing in accordance with the present invention.

Turning now to FIG. 4, there is shown a structural diagram illustrating the first embodiment in a cross-sectional view of the elements in making the screwless fiber optic module package 20 before sealing in accordance with the present invention. The lid 10 is placed into the module housing 15 in preparation for making a metal-to-metal contact seal without the use of any screws between the lid 10 and the module housing 15. The center die 30 is positioned on a top surface of the lid 10 or asserting pressure on the lid 10 so that the knife-shaped edge 16 of the module housing 15 bites into the bottom surface 12 of the lid 10. The surrounding forming die 35 is positioned around the edges of the lid 10 in preparation for exerting pressure on the cylindrical-shaped slot 11 so that an outer wall of the cylindrical-shaped slot 11 enters into the side slot of 17 in the module housing to form the holding mechanism between the lid and the module housing 15.

Figure 5:
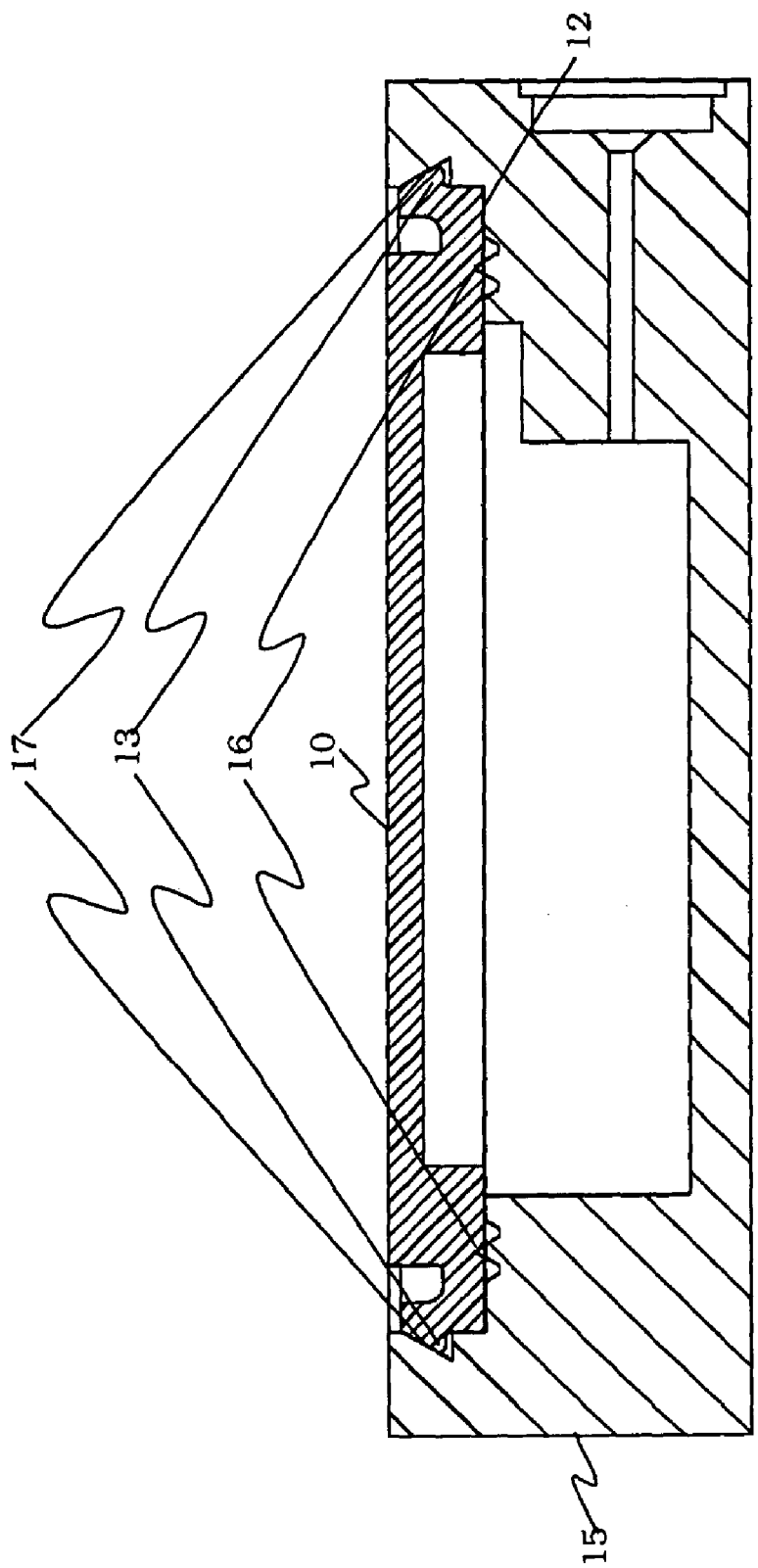
FIG. 5 is a structural diagram illustrating the first embodiment in a cross-sectional view of the screwless fiber optic module package that has been hermetically sealed by using the metal-to-metal contact seal in accordance with the present invention.

FIG. 5 is a structural diagram illustrating the first embodiment in a cross-sectional view of the screwless fiber optic module package that has been hermetically sealed by using a metal-to-metal contact seal in accordance with the present invention. First, the sealing mechanism between the lid 10 and the module housing 15 is formed when the knife-shaped edge 16 bites into the bottom surface 12 of the lid by using the center die 30 to press the lid 10 into the module housing 15. Second, the holding mechanism between the lid 10 and the module housing 15 is formed when the outer wall of the cylindrical-shaped slot 11 penetrates into the side slot 17 of the module housing 15 when the surrounding forming die 35 presses the cylindrical-shaped slot 11 of the lid 10 into the side slot 17 of the module housing 15. Together, the sealing mechanism and the holding mechanism provide the interlocking mechanisms necessary to hermetically seal the lid 10 and the module housing 15 in place to manufacture the screwless fiber optic module package 20.

Figure 6:
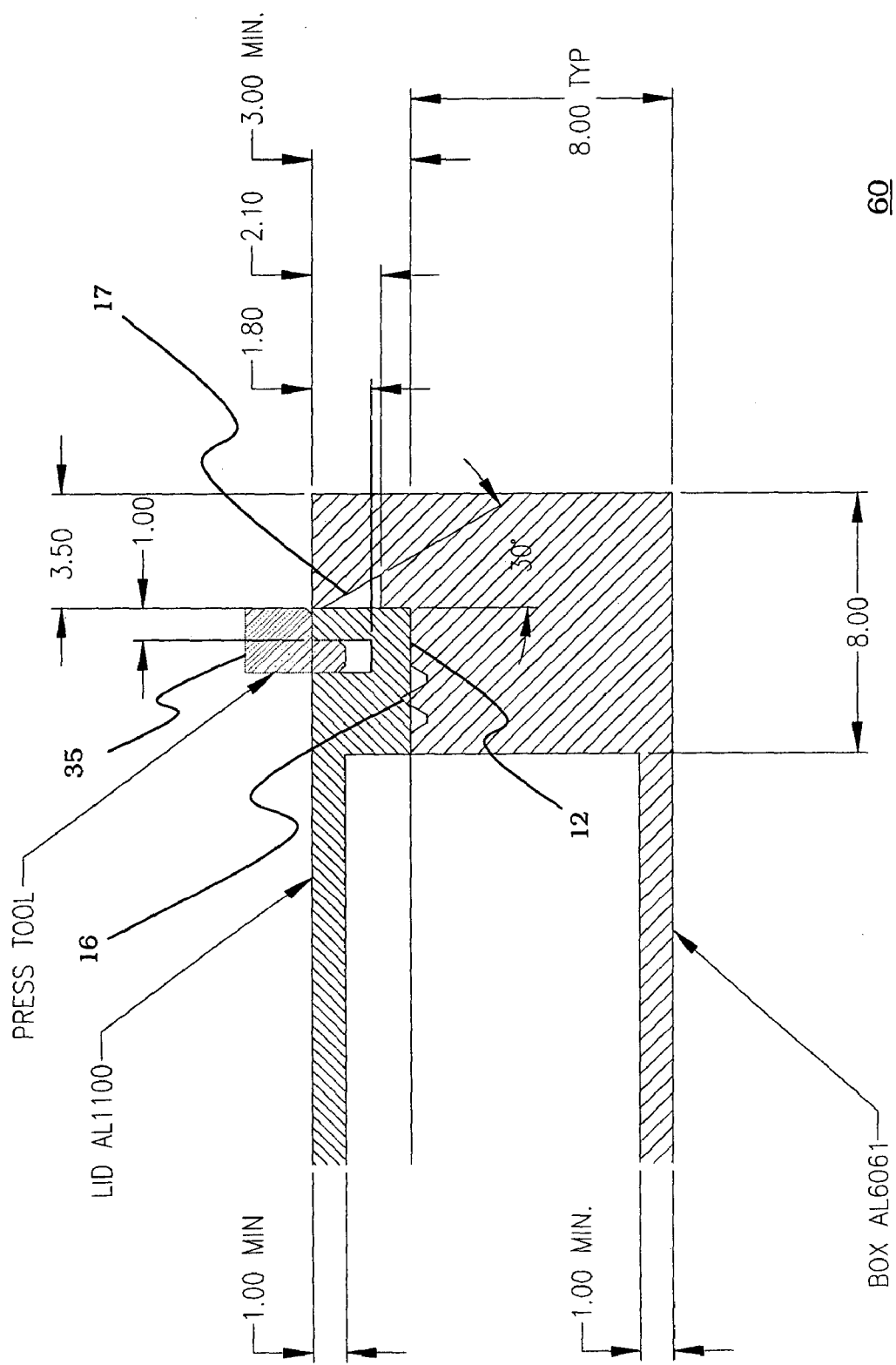
FIG. 6 is a structural diagram illustrating an exemplary dimension in the first embodiment of the screwless fiber optic module package with a cross-sectional view of the sealing mechanism after compression and the holding mechanism before compression in accordance with the present invention.

In FIG. 6, there is shown a structural diagram illustrating an exemplary dimension in the first embodiment of the screwless fiber optic module package with a cross-sectional view of the sealing mechanism after compression and the holding mechanism before compression in accordance with the present invention. In this figure, the center die 30 has exerted pressure in a center area of the lid 10 so that the knife-shaped edge 16 of the module housing 15 penetrates through the bottom surface 12 of the lid 10. The surrounding forming die 35 has yet to exert pressure on the edge of the lid 10. Rather, the surrounding forming die 35 is placed over the cylindrical-shaped slot 11 of the lid 10 in preparation of exerting pressure on the cylindrical-shaped slot 11 for penetration into the side slot 17 of the module housing 15.

Figure 7:
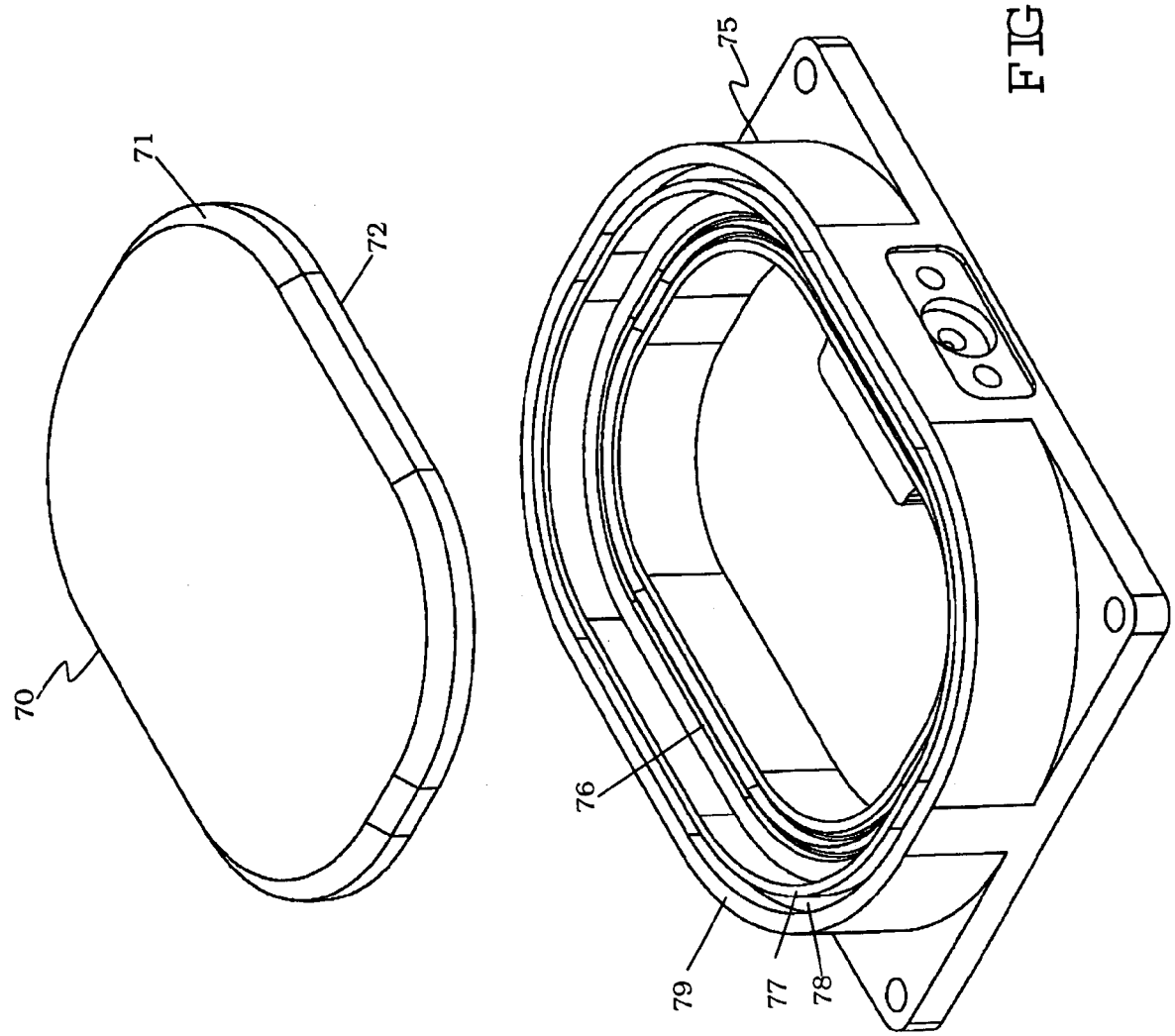
FIG. 7 is a structural diagram illustrating a second embodiment in an exploded ISO view of a lid and a module housing before sealing in accordance with the present invention.

Referring now to FIG. 7, there is shown a structural diagram illustrating a second embodiment in an exploded ISO view of a lid 70 and a module housing 75 before sealing in accordance with the present invention. The dimension of the lid 70 is suitable for placement into the module housing 75. The lid 70 has a curved surface 71 around the outer edge of the lid 70 for serving as a holding mechanism between the lid 70 and the module housing 75 after compression.

The module housing 75 also has a knife-shaped edge 76 surrounding the interior of the module housing 75 for biting into the lid 70 to form a sealing mechanism, similar to the knife-shaped edge 16 in the module housing 15 as described with respect to FIG. 1. The knife-shaped edge 76 protrudes upward for making contact with a bottom surface 72 of the lid 70 when the lid 70 is placed over the module housing 75. The knife-shaped edge 76 resembles a sharp edge that has a knife-edge quality which is able to bite into the bottom surface 72 of the lid 70 when pressure is applied to the lid 70.

The module housing 75 further has a slot 78 between an interior wall 77 and an exterior wall 79. The interior wall 77 in the module housing 75 and the curved surface 71 of the lid serve as a holding mechanism between the lid 70 and the module housing 75 after compression.

As for the materials selected for the lid 70 and the module housing 75, similar to the first embodiment in FIG. 1, the lid 70 and the module housing 75 can be selected from a various combination of materials. For example, the module housing 75 can be made from a hard material, such as a hard aluminum (like Alloy 6061), while the lid 70 is made from a soft aluminum (like Alloy 1100). One of ordinary skill in the art should recognize that other types of materials can be used to make the lid 70 as well as the module housing 75, such as aluminum alloy, stainless steel, copper, and titanium, without departing from the spirits of the present invention.

Figure 8:
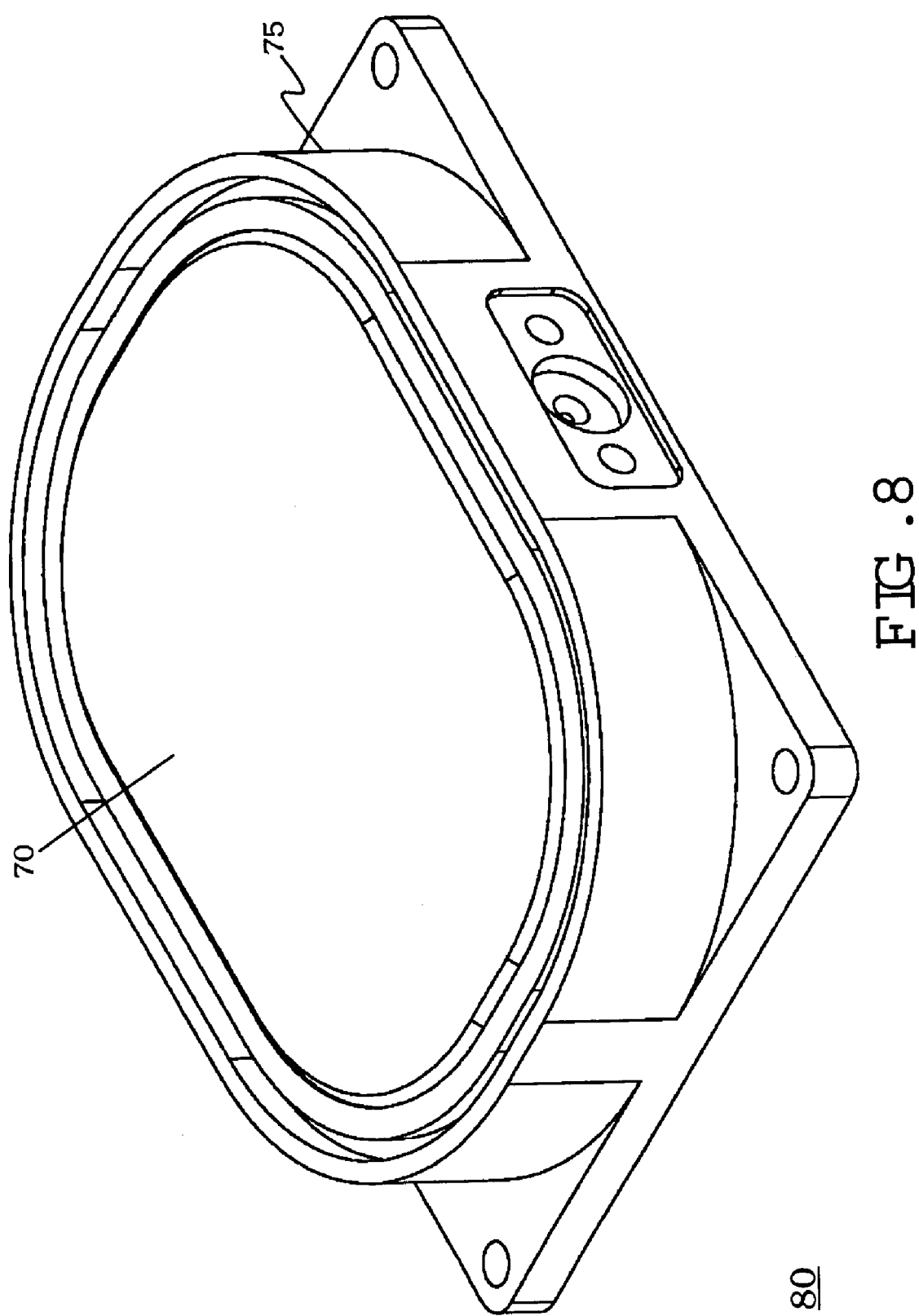
FIG. 8 is a structural diagram illustrating the second embodiment in an ISO view of a screwless fiber optic module package after sealing in accordance with the present invention.

In FIG. 8, there is shown a structural diagram illustrating the second embodiment in an ISO view of a screwless fiber optic module package 80 after sealing in accordance with the present invention. The lid 70 is first inserted into the module housing 75, which is followed by using the center die 30 for exerting pressure on the lid 70 so that the knife-edge 76 of module housing 75 bites into the bottom surface 72 of the lid 70 to form a sealing mechanism, which is followed by using a surrounding forming die 90 (shown in FIG. 10) that exerts pressure on the interior wall 77 of the module housing 75 into the curved surface 71 of the lid 70 to form a holding mechanism.

Figure 9:
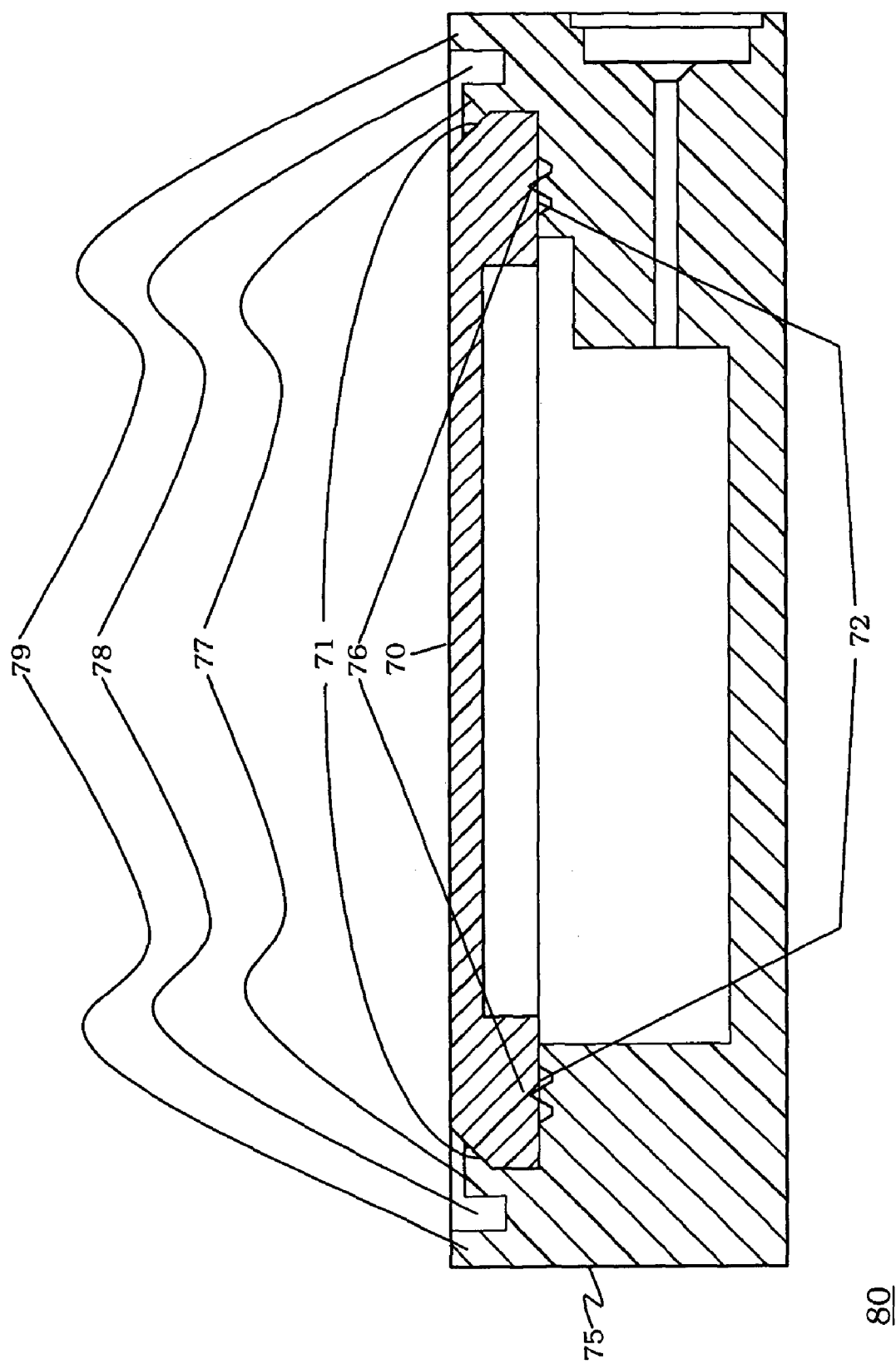
FIG. 9 is a structural diagram illustrating the second embodiment in a cross-sectional view of the screwless fiber optic module package that has been hermetically sealed by using a metal-to-metal contact seal in accordance with the present invention.

Turning now to FIG. 9, there is shown a structural diagram illustrating the second embodiment in a cross-sectional view of the screwless fiber optic module package 80 which has been hermetically sealed by using a metal-to-metal contact seal in accordance with the present invention. First, the sealing mechanism between the lid 70 and the module housing 75 is formed when the knife-shaped edge 76 bites into the bottom surface 72 of the lid by using the center die 30 to presses the lid 70 into the module housing 75. Second, the holding mechanism between the lid 70 and the module housing 75 is formed when the interior wall 77 of the module housing 75 penetrates into the curved surface 71 of the lid 70 by using the surrounding forming die 90 to press the interior wall 77 into the curved surface 71. As shown in FIG. 9, the interior 77 is extended into the curved surface 71 for serving as the holding mechanism between the lid 70 and the module housing 75. Together, the sealing mechanism and the holding mechanism provide the interlocking mechanisms necessary to hermetically seals the lid 70 and the module housing 75 in place to manufacture the screwless fiber optic module package 80.

In FIG. 10, there is shown a structural diagram illustrating an exemplary dimension in the second embodiment of the screwless fiber optic module package with a cross-sectional view of the sealing mechanism after compression and the holding mechanism before compression in accordance with the present invention. In this figure, the center die 30 has exerted pressure in the center area of the lid 70 so that the knife-shaped edge 76 of the module housing 75 penetrates through the bottom surface 72 of the lid 70. The surrounding forming die 90 has yet to exert pressure on the interior wall 77 of the module housing 75. Rather, the surrounding forming die 90 is placed over the interior wall 77 of the module housing 75 in preparation for exerting pressure on the interior wall 77 for penetration into the curved surface 71 of the lid 70.

Figure 11A:
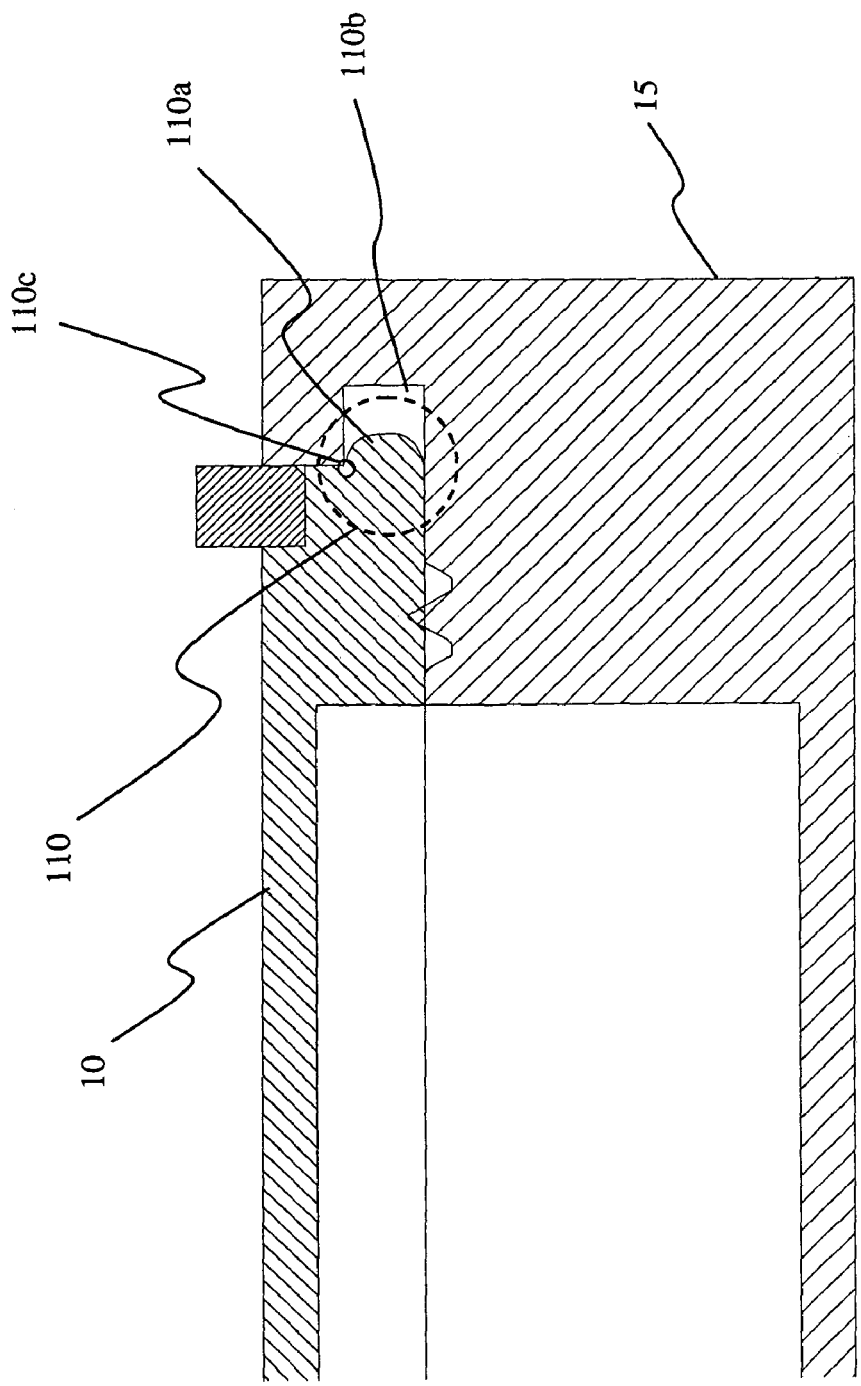
FIGS. 11A–11C are structural diagrams illustrating alternative holding mechanisms between the lid and the module housing in accordance with the present invention.
Figure 11B:
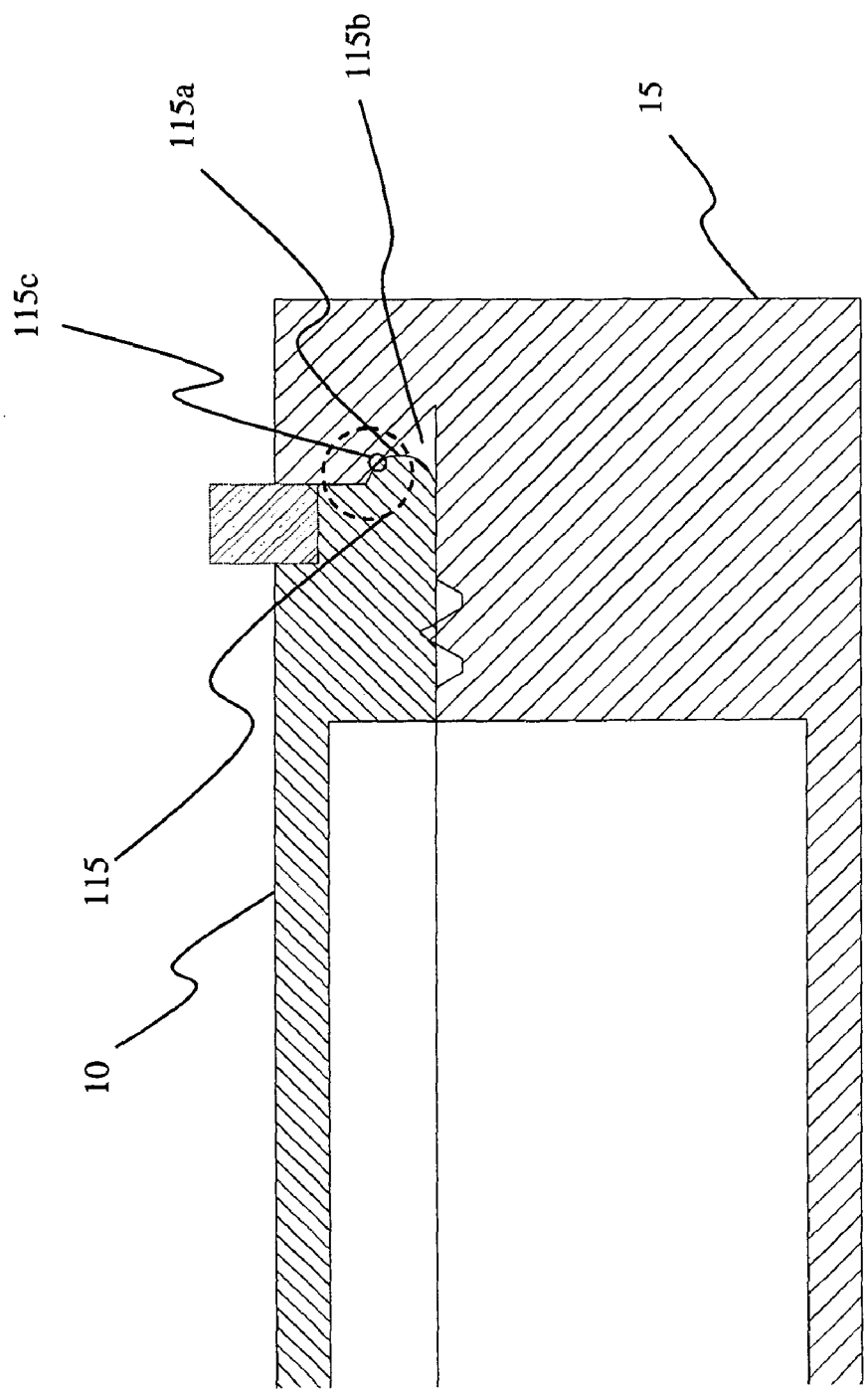
Figure 11C:
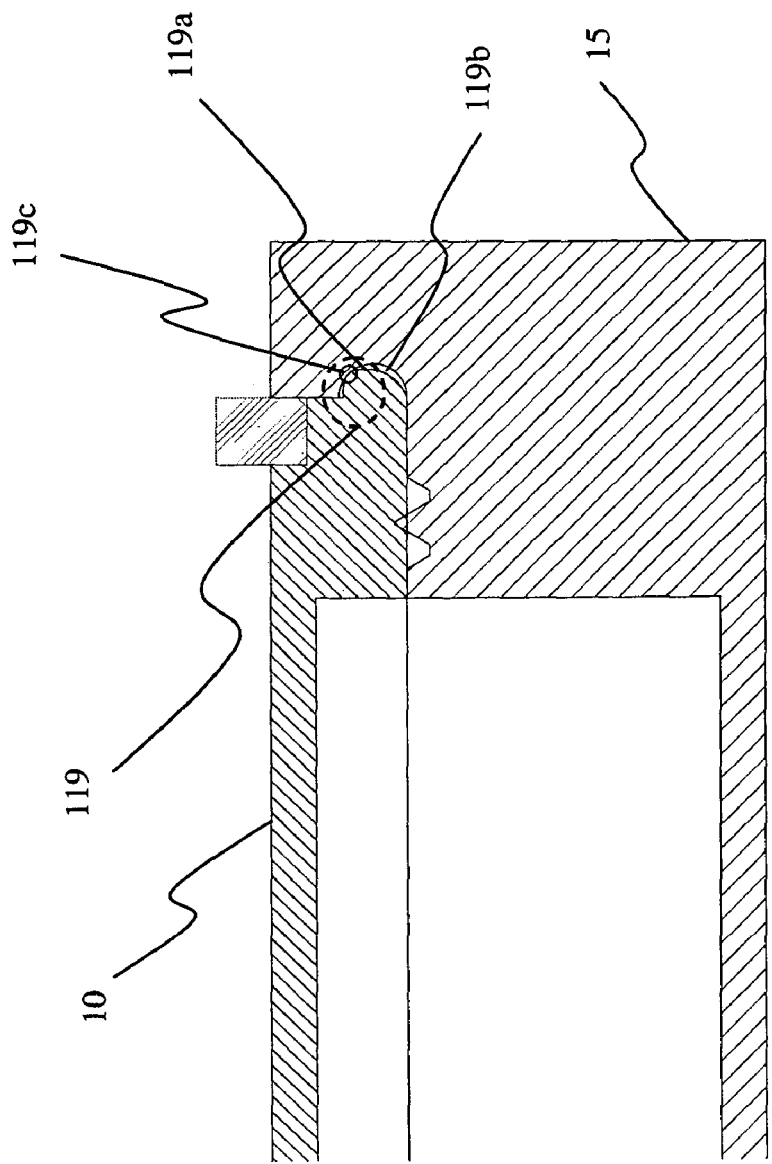

One of ordinary skill in the art should recognize that other form of holding mechanisms can be practiced without departing from the spirits of the present invention, such as the holding mechanisms or holding means 110, 115, and 119 shown in FIGS. 11A, 11B, and 11C, respectively. In FIG. 11A, a portion 110a of the lid 10 enters into a cavity 110b of the module housing 15 with a holding pressure point 110c that interlocks the lid 10 and the module housing 15. In FIG. 11B, a portion 115a of the lid 10 enters into a cavity 115b of the module housing 15 with a holding pressure point 115c that interlocks the lid 10 and the module housing 15. In FIG. 11C, a portion 119a of the lid 10 enters into a cavity 119b of the module housing 15 with a holding pressure point 119c that interlocks the lid 10 and the module housing 15. The actual shapes of the lid 10 and the modeling housing 15 could vary depending on a particular type of holding mechanism chosen for holding the lid 10 and the module housing 15 in place.

Figure 12:
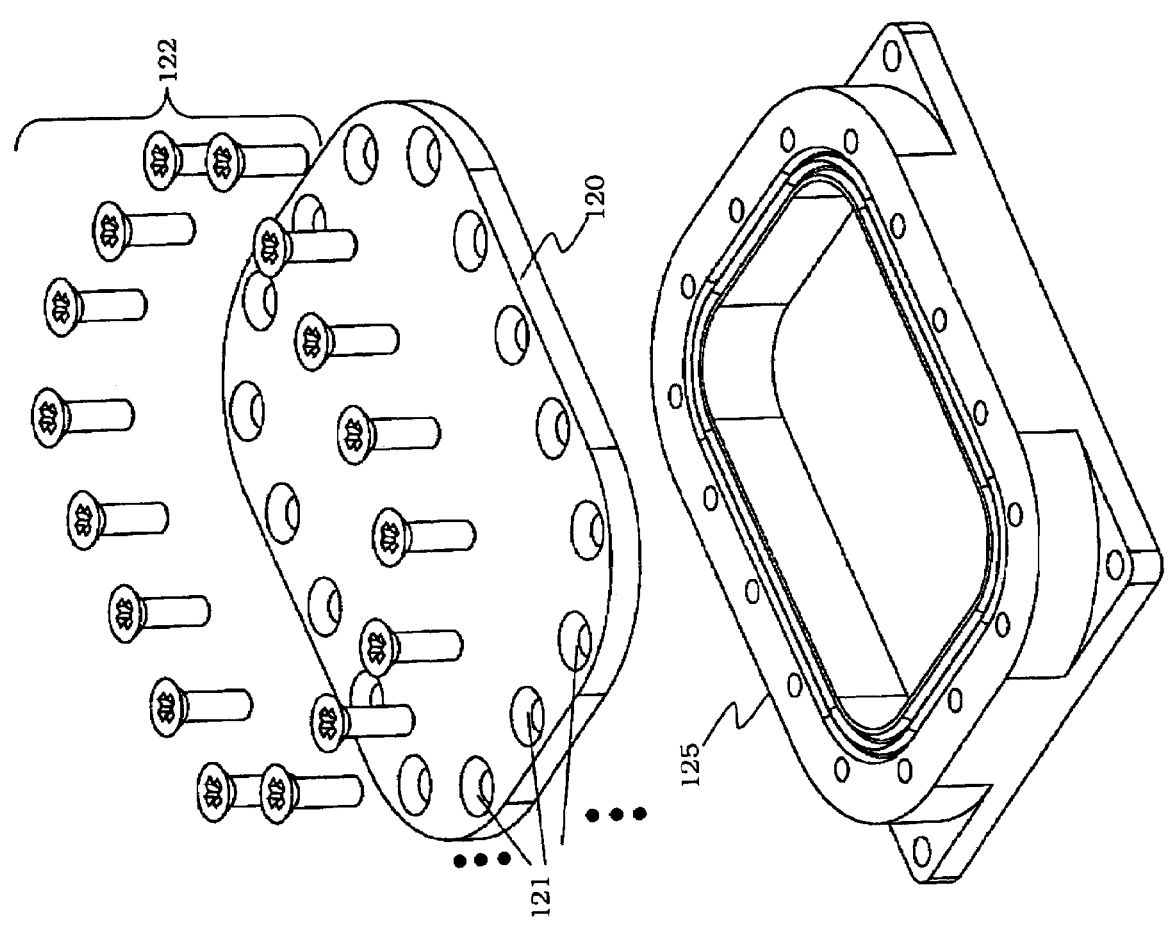
FIG. 12 is a structural diagram illustrating a third embodiment in an exploded ISO view of a lid and a module housing before sealing in accordance with the present invention.
Figure 13:
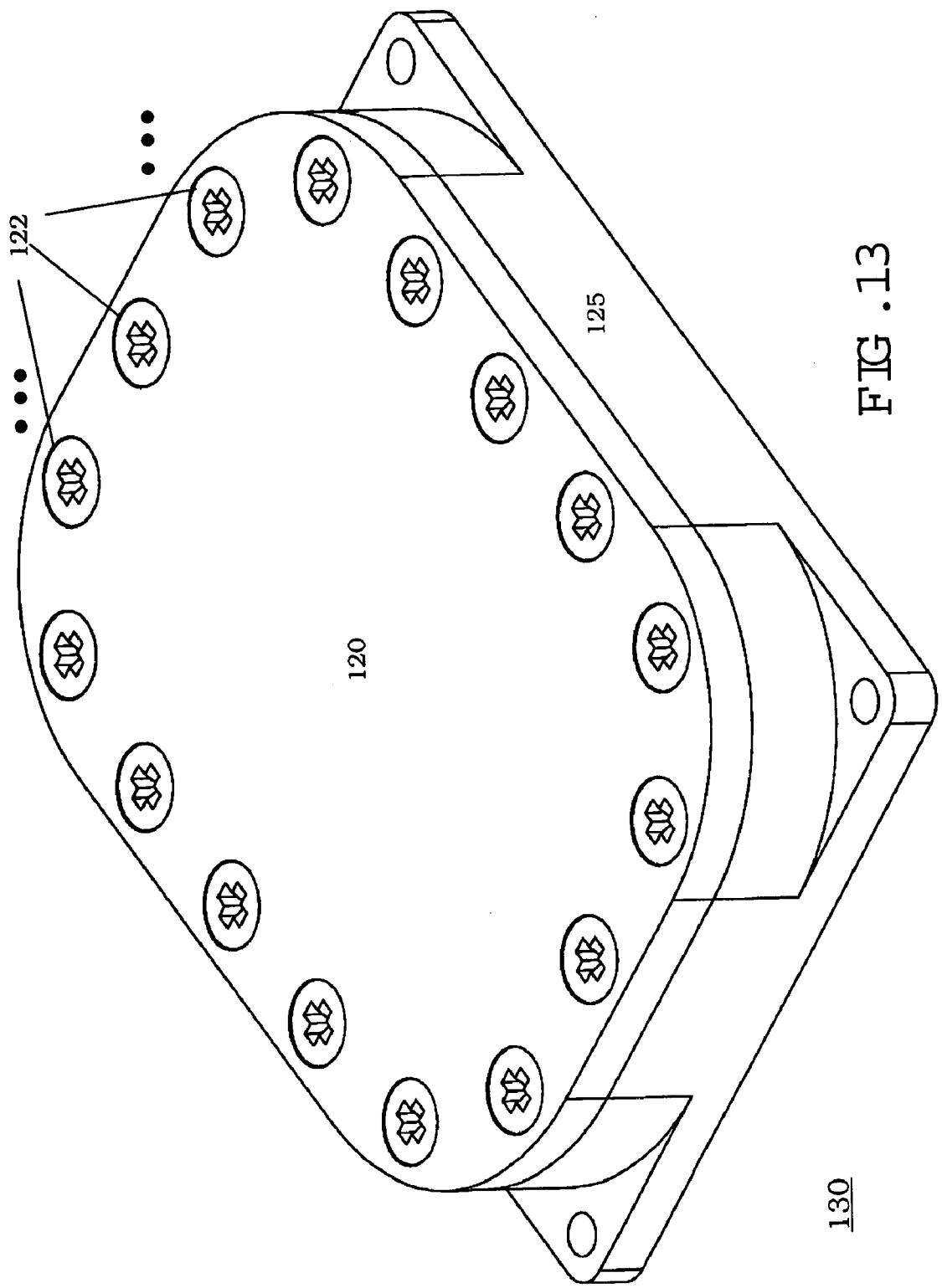
FIG. 13 is a structural diagram illustrating the third embodiment in an ISO view of the lid and the module housing after sealing in accordance with the present invention.

Referring now to FIG. 12, there is shown a structural diagram illustrating a third embodiment in an exploded ISO view of a lid 120 and a module housing 125 before sealing in accordance with the present invention. The lid 120 has a plurality of holes 121 surrounding the edges of the lid 120 where a plurality of corresponding screws 122 are used for tightening the lid 120 onto the module housing 125 through the plurality of holes 121. In FIG. 13, there is shown a structural diagram illustrating the third embodiment in an exploded ISO view of the lid 120 and the module housing 125 after sealing in accordance with the present invention. The lid 120 and the module housing 125 are held together by the plurality of screws 122 to form the fiber optic module package 130.

Figure 14:
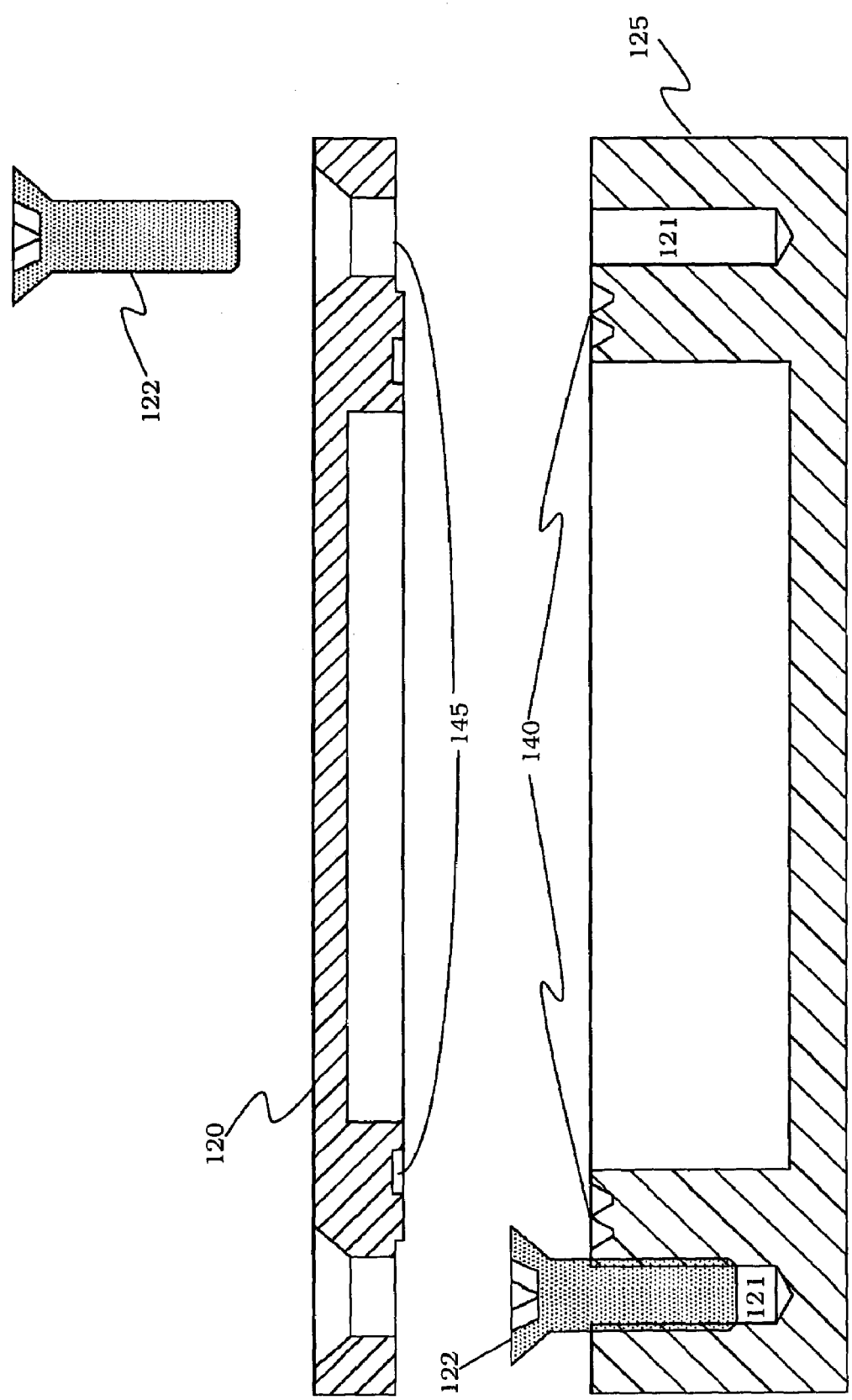
FIG. 14 is a structural diagram illustrating the third embodiment in an exploded cross-sectional view of the lid and the module housing before sealing in accordance with the present invention.

Turning now to FIG. 14, there is shown a structural diagram illustrating the third embodiment in an exploded cross-sectional view of the lid 120 and the module housing 125 before sealing in accordance with the present invention. In this embodiment, the module housing 125 has a knife-shaped edge 140 where the tip of the knife-edge is at the same height as the top surface of the module housing 125. The lid 120 has a slot 145 for placement over the knife-edge 140. The sealing mechanism between the lid 120 and the module housing 145 is formed when pressure is exerted on the lid so that the knife-edge 140 bites into the lid 120. The plurality of screws 122 serve as a holding mechanism between the lid 120 and the module housing 125 when the plurality of screws 122 are pressed through the holes 121 of the lid and into the module housing 125.

Figure 15:
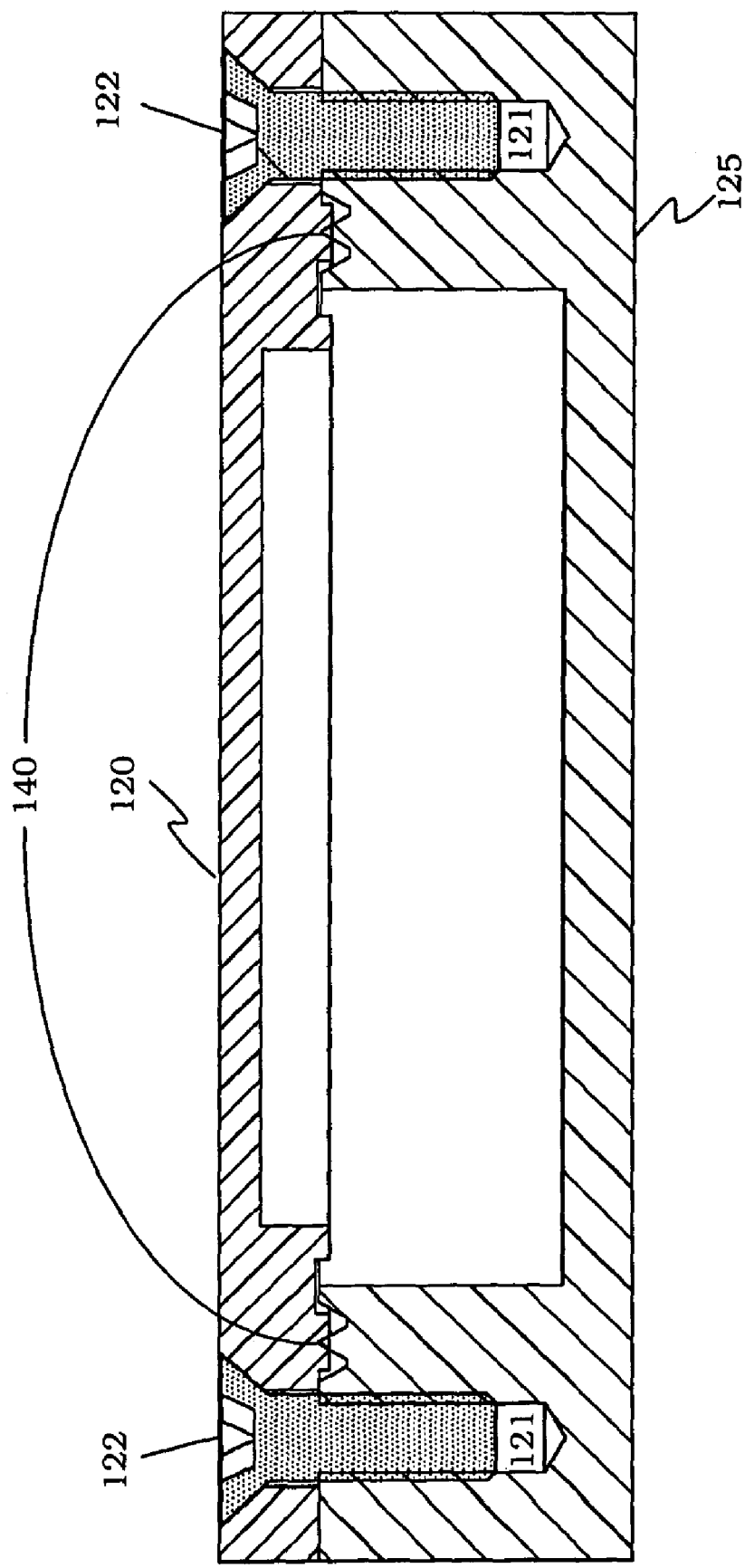
FIG. 15 is a structural diagram illustrating the third embodiment in a cross-sectional view of the lid and the module housing after sealing in accordance with the present invention.

FIG. 15 is a structural diagram illustrating the third embodiment in an exploded cross-sectional view of the lid 120 and the module housing 125 after sealing in accordance with the present invention. After compressing the lid 120 into the module housing 125, the fiber optic module package 130 has been hermetically sealed and assembled. The sealing mechanism between the lid 120 and the module housing 125 is formed with the knife-edge 140 biting into the bottom surface of the lid 120. The holding mechanism is formed with the plurality of screws 122 are inserted through the plurality of holes 121 of the lid and into the module housing 125.

The above embodiments are only illustrative of the principles of this invention and are not intended to limit the invention to the particular embodiments described. For example, one of ordinary skill in the art should recognize that the knife-shaped edge 16 does not need to be protruding upward, rather the knife-shaped edge 16 can be flat (see, for example, FIG. 14) or beneath the top surface of a module housing. Moreover, the lid 10 and the module housing 15 can be made from a various combination of soft and hard materials in the first embodiment, such as both the lid 10 and the module housing 15 are made of soft materials, a hard material for the lid 10 and a hard material for the module housing 15, and a hard material for the lid 10 and a soft material for the module housing 15. In addition, the lid 10 and the module housing 15 can both use the same material but with a different hardness, such as using a soft aluminum for the lid 10 and a hard aluminum for the module housing 15, or a different material, such as using copper for the lid 10 and aluminum for the module housing 15. Similarly, the lid 70 and the module housing 75 can be made from a various combination of soft and hard materials in the second embodiment, such as the lid 70 and the module housing 75 can both be made of soft materials for the lid 70 and the module housing 75, a hard material for the lid 70 and a hard material for the module housing 75, a hard material for the lid 70 and a soft material for the module housing 75. Furthermore, the lid 70 and the module housing 75 can both use the same material, such as using a soft aluminum for the lid 70 and a hard aluminum for the module housing 75, or a different material, such as using copper for the lid 70 and aluminum for the module housing 75. When the materials selected for the lid 10 and the module housing 15 in the first embodiment or the lid 70 and the module housing 75 in the second embodiment have been changed, one of ordinary skill in the art should recognize that an alternate variation of the metal-to-metal contact seal may need to be used rather than using a knife-shaped edge as the basis to form the sealing line. Accordingly, various modifications, adaptations, and combinations of various features of the described embodiments can be practiced without departing from the scope of the invention as set forth in the appended claims.

We claim:

1. A fiber optic module package, comprising:
a lid having a bottom surface and a cylindrical-shaped slot extending around a perimeter of the lid; and
a module housing having a knife-shaped edge and a side slot, wherein the lid and the module housing are sealed when the knife-shaped edge bites into the bottom surface of the lid to form a sealing mechanism.

2. The fiber optic module package of claim 1, further comprising a center die for pressing the lid onto the module housing such that the knife-shaped edge bites into the bottom surface of the lid.

3. The fiber optic module package of claim 1, wherein the lid is made of a soft aluminum material and the module housing is made of a hard aluminum material.

4. The fiber optic module package of claim 3, wherein the soft aluminum material of the lid comprises Alloy 1100; and wherein and the hard aluminum material of the module housing comprises Alloy 6061.

5. The fiber optic module package of claim 1, wherein the lid is made from a first material and the module housing is made from a second material.

6. The fiber optic module package of claim 5, wherein the first material of the lid comprises aluminum alloy, stainless steel, copper, or titanium.

7. The fiber optic module package of claim 6, wherein the second material of the module housing comprises aluminum alloy, stainless steel, copper, or titanium.

8. The fiber optic module housing of claim 1, wherein the lid is made from the same material as the module housing.

9. The fiber optic module package of claim 1, wherein the cylindrical-shaped slot defines at least a portion of an outer wall of the lid.

10. A fiber optic module package, comprising:
a lid; and
a module housing having a cavity with an upper wall, a side wall and a lower wall, the module housing further having a knife-shaped edge that bites into a bottom surface of the lid when the lid is pressed onto the module housing to form a metal-to-metal contact sealing mechanism, wherein the lid and the module housing are held together when a portion of the lid enters into the cavity and forms a holding pressure point proximate the upper wall of the cavity that interlocks the lid and the module housing.

11. The fiber optic module package of claim 10, wherein the lid is made of a soft aluminum material and the module housing is made of a soft aluminum material.

12. The fiber optic module package of claim 10, wherein the lid is made of a hard aluminum material and the module housing is made of a hard aluminum material.

13. The fiber optic module package of claim 10, wherein the lid is made of a hard aluminum material and the module housing is made of a soft aluminum material.

14. The fiber optic module package of claim 10, wherein the lid is made from a first material and the module housing is made from a second material.

15. The fiber optic module package of claim 14, wherein the first material of the lid comprises aluminum alloy, stainless steel, copper, or titanium.

16. The fiber optic module package of claim 15, wherein the second material of the module housing comprises aluminum alloy, stainless steel, copper, or titanium.

17. The fiber optic module package of claim 10, wherein the lid is made from the same material as the module housing.

18. The fiber optic module package of claim 10, wherein a cross-section of the module housing cavity is substantially rectangular-shaped.

19. The fiber optic module package of claim 10, wherein a cross-section of the module housing cavity is substantially triangular-shaped.

20. The fiber optic module package of claim 10, wherein a cross-section of the module housing cavity is substantially semi-circular-shaped.

21. A fiber optic module package, comprising:
a lid having a bottom surface and a slot with an outer wall; and
a module housing having a knife-shaped edge and a side slot, wherein the lid and the module housing are sealed when the knife-shaped edge bites into the bottom surface of the lid to form a sealing mechanism and the lid and the module housing are held together when the outer wall of the slot of the lid enters into the side slot of the module housing to form a holding mechanism.

22. The fiber optic module package of claim 21, further comprising a surrounding forming die for pressing the outer wall of the slot of the lid into the side slot of the module housing.

* * * * *